US006852651B2

(12) United States Patent
Shioya et al.

(10) Patent No.: US 6,852,651 B2
(45) Date of Patent: Feb. 8, 2005

(54) SEMICONDUCTOR DEVICE AND METHOD OF MANUFACTURING THE SAME

(75) Inventors: Yoshimi Shioya, Tokyo (JP); Yuichiro Kotake, Tokyo (JP); Tomomi Suzuki, Tokyo (JP); Hiroshi Ikakura, Tokyo (JP); Kazuo Maeda, Tokyo (JP)

(73) Assignees: Canon Sales Co., Inc. (JP); Semiconductor Process Laboratory Co., Ltd. (JP)

(*) Notice: Subject to any disclaimer, the term of this patent is extended or adjusted under 35 U.S.C. 154(b) by 0 days.

(21) Appl. No.: 09/967,991

(22) Filed: Oct. 2, 2001

(65) Prior Publication Data

US 2002/0113316 A1 Aug. 22, 2002

(30) Foreign Application Priority Data

Dec. 19, 2000 (JP) .................................. 2000-384825
Jun. 28, 2001 (JP) .................................. 2001-197279

(51) Int. Cl.[7] .......................................... H01L 21/469
(52) U.S. Cl. ...................... 438/790; 438/778; 438/789
(58) Field of Search ................................ 438/687, 778, 438/624, 625, 790, 789; 427/569, 579

(56) References Cited

U.S. PATENT DOCUMENTS

| | | | | |
|---|---|---|---|---|
| 4,988,573 A | * | 1/1991 | Nakayama et al. | 428/421 |
| 5,821,168 A | | 10/1998 | Jain | 438/692 |
| 6,051,321 A | * | 4/2000 | Lee et al. | 428/447 |
| 6,054,379 A | | 4/2000 | Yau et al. | 438/623 |
| 6,068,884 A | * | 5/2000 | Rose et al. | 427/255.6 |
| 6,121,162 A | | 9/2000 | Endo | 438/787 |
| 6,127,285 A | * | 10/2000 | Nag | 438/788 |
| 6,147,009 A | | 11/2000 | Grill et al. | 438/780 |
| 6,346,302 B2 | * | 2/2002 | Kishimoto et al. | 427/569 |
| 6,387,824 B1 | * | 5/2002 | Aoi | 438/778 |
| 6,436,824 B1 | * | 8/2002 | Chooi et al. | 438/687 |
| 2001/0055672 A1 | * | 12/2001 | Todd | 428/212 |
| 2002/0034625 A1 | * | 3/2002 | Grill et al. | 428/304.4 |

FOREIGN PATENT DOCUMENTS

| | | |
|---|---|---|
| EP | 0 881 678 A2 | 5/1998 |
| EP | 1 128 421 A2 | 2/2001 |
| EP | 1 158 577 A2 | 5/2001 |
| JP | 08227888 * | 9/1996 |
| JP | 410176273 A * | 12/1996 |
| JP | 10-335322 | 12/1998 |
| JP | 11-288931 | 10/1999 |
| WO | 98/50945 | 11/1998 |

OTHER PUBLICATIONS

Electrochem. Soc. Fall Meeting Abstracts, 1998, Loboda et al, p. 344.
SEMICON Korea Technical Sym., 2000, p. 279.
The Japan Society of Applied Physics the 46th Spring Meeting Digests, 1999, p. 897, Endo et al.
The Japan Society of Applied Physics the 60th Fall Meeting Digests, 1999, p. 712, Matsuki et al.
The Japan Society of Applied Physics the 46th Spring Meeting Digeists, 1999, Uchida et al, p. 897.

* cited by examiner

*Primary Examiner*—Caridad Everhart
(74) *Attorney, Agent, or Firm*—Lorusso, Loud & Kelly

(57) ABSTRACT

The present invention relates to a semiconductor device in which an interlayer insulating film having a low dielectric constant is formed by covering wiring primarily made of a copper film, and to a method of manufacturing the same. In manufacturing the semiconductor device an insulating film having a low dielectric constant is formed on a substrate by converting a film-forming gas into a plasma for reaction. The method includes forming a low-pressure insulating film on the substrate by coverting the film-forming gas at a first gas pressure into a plasma and forming a high-pressure insulating film on the low-pressure insulating film by converting the film-forming gas at second gas pressure, higher than the first gas pressure, into a plasma and reaction.

23 Claims, 9 Drawing Sheets

SEMICONDUCTOR DEVICE AND METHOD OF MANUFACTURING THE SAME

BACKGROUND OF THE INVENTION

1. Field of the Invention

The present invention relates to a semiconductor device in which an interlayer insulating film having a low dielectric constant is formed by covering wiring primarily made of a copper film, and to a method of manufacturing the same.

2. Description of the Prior Art

In recent years, increase in the speed of data transfer has been required along with progress in higher integration and higher density in semiconductor integrated circuit devices. For this reason, an insulating film that has a low dielectric constant for small RC delay (hereinafter referred to as a low dielectric insulating film) is used.

In order to form such low dielectric insulating film, a plasma enhanced CVD method that uses trimethylsilane ($SiH(CH_3)_3$) and $N_2O$ has been employed as disclosed, for example, in "M. J. Loboda, J. A. Seifferly, R. F. Schneider, and C. M. Grove: Electrochem. Soc. Fall Meeting Abstracts, p.344, (1998)" and the like. Another plasma enhanced CVD method that uses tetramethylsilane ($Si(CH_3)_4$) and $N_2O$, is described in "J Shi, M. A-Piano, T. Mountsier, and S. Nag, SEMICON Korea Technical Symposium 2000, p.279 (2000)" and the like.

Plasma enhanced CVD methods that use phenylsilane and the like are also known, as described, for example, in "Kazuhiko Endo, Keisuke Shinoda, Toru Tatsumi: The Japan Society of Applied Physics The 46th Spring Meeting Digests (1999), p. 897," "Nobuo Matsushita, Yoshinori Morisada, Yuichi Naito, Aya Matsunoshita: The Japan Society of Applied Physics The 60th Fall Meeting Digests (1999), 1p-ZN-9 (1999)," "Yasutaka Uchida, Takeo Matsuzawa, Satoshi Kanno, Masakiyo Matsumura: The Japan Society of Applied Physics The 4th Spring Meeting Digests, p.897 (1999)" and the like.

However, the low dielectric insulating film formed by the above-mentioned methods is relatively weak in adhesion strength with wiring primarily made of a copper film and is low in film hardness.

SUMMARY OF THE INVENTION

An object of the present invention is to provide, in the manufacturing of a semiconductor device, a method of forming an insulating film that has a low dielectric constant, the insulating film also having a good adhesion property with wiring primarily made of a copper film and appropriate film hardness, and a semiconductor device produced by the method.

In this invention, film forming is performed with adjusting pressure of a film-forming gas. Specifically, film forming is performed under low gas pressure at an initial stage of film forming, then under high gas pressure for the remainder of the film forming.

For example, the invention involves forming an insulating film (hereinafter, referred to as a low-pressure insulating film) on a substrate by converting a film-forming gas into a plasma state with a gas pressure below 1 Torr, and forming an insulating film (hereinafter, referred to as a high-pressure insulating film) on the low-pressure insulating film by converting a film-forming gas formed into a plasma state with a gas pressure of 1 Torr or higher.

According to an experiment carried out by the inventor of the present invention, as shown in FIG. 2, the degree of exfoliation between the substrate and the insulating film is inversely proportional to the pressure of the film-forming gas. The exfoliation tendency is extremely high under a gas pressure below 1 Torr. On the other hand, as shown in FIG. 6, the dielectric constant of the film is high for the film formed under low gas pressure, and low for the film formed under high gas pressure.

Accordingly, film forming is performed by reaction with the film-forming gas at a low pressure converted into a plasma state at the initial stage of film forming and, thereafter, film forming is performed by converting the film-forming gas at a high pressure into a plasma, whereby an insulating film with high adhesion and a low dielectric constant as a whole can be formed. In the experiment, film forming is performed on a silicon substrate, however, the same result may be obtained when the film is formed on a copper substrate.

In forming the plasma, a low frequency is used for forming both the low-pressure insulating film and the high-pressure insulating film.

Basically, film forming with electric power of a low frequency imparts strong adhesive force, however, the adhesive strength is increased even more when film forming is performed by use of a film-forming gas of low pressure at the initial stage of the film forming.

In addition, using a nitrogen-containing gas such as ammonia ($NH_3$) or nitrogen ($N_2$) as a film-forming gas for forming a barrier insulating film improves the barrier property. Alternatively, by using nitrogen ($N_2$), an inert gas such as helium (He) or argon (Ar) or the like, the film-forming gas can be diluted without losing the adhesive force of the formed film.

The invention is applied to a method of forming a barrier insulating film as a base for the main insulating film and a main insulating film having a low dielectric constant. However, in forming just the main insulating film having a low dielectric constant, the gas pressure does not have to be changed during the film forming. In this case, by use of a film-forming gas containing: an alkyl compound having a siloxane bond; any one of acetylene ($C_2H_2$), methylcyclohexane ($CH_3C_6H_{11}$) and cyclohexane ($C_6H_{12}$); and an oxygen-containing gas, or a film-forming gas including: an alkyl compound having a siloxane bond; benzene ($C_6H_6$); an oxygen-containing gas; and an inert gas, a desired main insulating film can be formed while maintaining the gas pressure unchanged.

A film-forming gas containing methylsilane ($SiH_n(CH_3)_{4-n}$: n=0, 1, 2, 3) instead of the alkyl compound having a siloxane bond may also be used.

DESCRIPTION OF THE PREFERRED EMBODIMENTS

Embodiments of the present invention will be explained with reference to the accompanying drawings hereinafter.
First Embodiment FIG. 1 is a side view showing a configuration of the parallel-plate type plasma enhanced CVD film forming apparatus 101 employed in a film forming method according to an embodiment of the present invention.

This plasma enhanced CVD film forming apparatus 101 comprises a film forming portion 101A wherein a silicon-containing insulating film is formed from the plasma gas on a substrate 21, and a film forming gas supply section 101B having a plurality of gas supply sources constituting the film forming gas.

Figure 1:
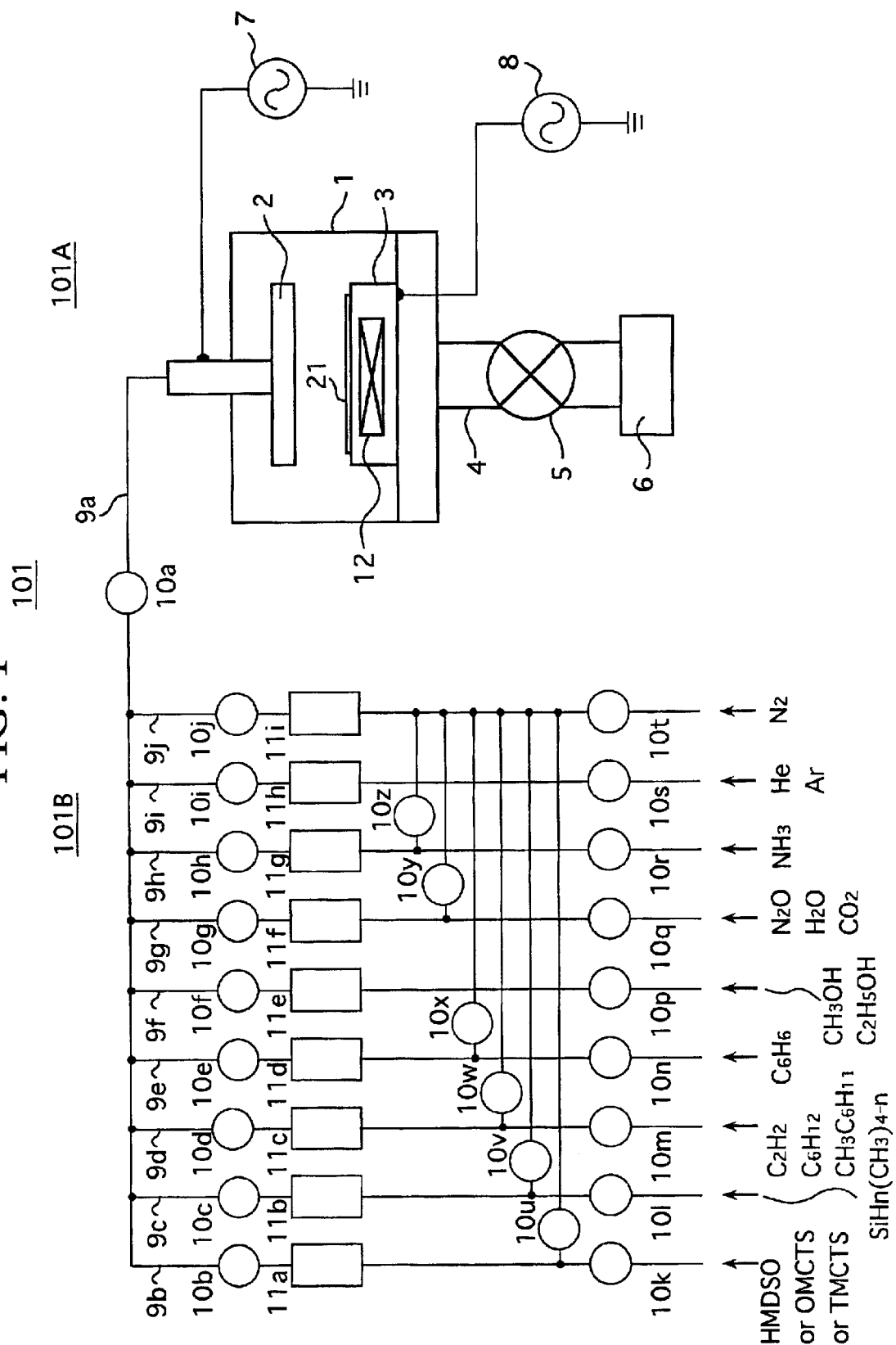
FIG. 1 is a side view of a plasma film-forming apparatus used for a method of manufacturing a semiconductor device according to an embodiment of the present invention.

As shown in FIG. 1, the film forming portion 101A has a chamber 1 whose pressure can be reduced, and the chamber 1 is connected to an exhaust device 6 via an exhaust pipe 4. A switching valve 5 for opening and closing communication between the chamber 1 and the exhaust device 6 is provided in the middle of the exhaust pipe 4. A pressure measuring means such as a vacuum gauge (not shown) is provided for monitoring the pressure in the chamber 1.

An upper electrode (second electrode) 2 and an opposing lower electrode (first electrode) 3 are provided in the chamber 1. A high frequency power supply (RF power supply) 7 for supplying high frequency power at a frequency of 13.56 MHz is connected to the upper electrode 2, while a low frequency electric power supply 8 for supplying low frequency electric power at a frequency of 380 kHz is connected to the lower electrode 3. The film forming gas is plasmanized by supplying power to the upper electrode 2 and the lower electrode 3 from these power supplies 7, 8. The upper electrode 2, the lower electrode 3, and the power supplies 7, 8 constitute the plasma generating means for plasmanizing the film forming gas.

The upper electrode 2 is also used as a film forming gas distributor. A plurality of through holes are formed in the upper electrode 2, and the openings of the through holes in the surface opposing the lower electrode 3 serve as discharge ports (inlet ports) for the film forming gas. The discharge ports of the film forming gas, etc., are connected to the film forming gas supply section 101B via a pipe 9a. Also, a heater (not shown) may be provided for the upper electrode 2. This is because, if the upper electrode 2 is heated at a temperature of almost 100° C. during the film formation, particles of reaction products of the film forming gas, etc., can be prevented from sticking onto the upper electrode 2.

The lower electrode 3 is also used as a loading table for the substrate 21. A heater 12 for heating the substrate 21 on the loading table is provided for the lower electrode 3.

In the film forming gas supply section 101B, a supply source for the alkyl compound having a siloxane bond; a supply source for methyl silane ($SiH_n(CH_3)_{4-n}$:n=0, 1, 2, 3); a supply source for any one of acetylene ($C_2H_2$), cyclohexane ($C_6H_{12}$) and methylcyclohexane ($CH_3C_6H_{11}$); a supply source for benzene ($C_6H_6$); a supply source for any one of methylalcohol ($CH_3OH$) and ethylalcohol ($C_2H_5OH$); a supply source for an oxygen-containing gas; a supply source for ammonia ($NH_3$); a supply source for an inert gas; and a supply source for the nitrogen ($N_2$) are provided.

These gases are supplied as appropriate to the chamber 1 of the film forming portion 101A via branch pipes 9b to 9j and a pipe 9a to which all branch pipes 9b to 9j are connected. Flow rate controlling means 11a to 11i and switching means 10b to 10n, 10p to 10t for opening and closing of the branch pipes 9b to 9j are provided in the middle of the branch pipes 9b to 9f. A switching means 10a for opening and closing the pipe 9a is provided in the middle of the pipe 9a.

Also, in order to purge the residual gas from the branch pipes 9b to 9e, 9g, 9h with the $N_2$ gas, switching means 10u to 10z are provided for controlling the opening and closing of communication between the branch pipe 9j, which is connected to the $N_2$ gas supply source, and the remaining branch pipes 9b to 9e, 9g, 9h. The $N_2$ gas purges the residual gas from the pipe 9a and the chamber 1 in addition to purging the branch pipes 9b to 9e, 9g, 9h. In addition, the $N_2$ gas also is employed as a diluting gas as needed.

Thus, the film forming equipment 101, as described above, is provided with a supply source for supplying the alkyl compound having siloxane bond, the supply source for supplying the hydrocarbon, the supply source for supplying the oxygen-containing gas and the supply source for supplying the inert gas, and is also provided with the plasma generating means 2, 3, 7, 8 for plasmanizing the film forming gas. In addition, the exhaust device 6 and flow rate controlling means 11a to 11i are provided.

Therefore, as shown in the following embodiments, it is possible to form an insulating film that has a low dielectric constant and a strong adhesion force to a wiring primarily made of a copper film.

The means for generating a plasma includes the upper and lower electrodes 2, 3 of the parallel-plate type, and the power supplies 7, 8 for supplying the power at high and low frequencies, respectively. The power supplies are respectively connected to the upper and lower electrodes 2, 3. Therefore, the plasma can be generated by applying the power at the high and low frequencies to the electrodes 2, 3, respectively. Thus, the insulating film formed in this manner is dense and has a low dielectric constant, because $CH_3$ is contained in the insulating film.

The following are preferred combinations with respect to application of power to the upper and lower electrodes 2, 3.

First, in forming a low-pressure insulating film, a low frequency electric power at 100 kHz or more and less than 1 MHz is applied to the lower electrode 3, or the low frequency electric power is applied to the lower electrode 3 and a high frequency electric power of 1 MHz or more is applied to the upper electrode 2. In the forming of a high-pressure insulating film, high frequency electric power is applied to the upper electrode 2.

Second, in forming a high-pressure insulating film, the low frequency electric power is applied to the lower electrode 3 in addition to applying the high frequency electric power to the upper electrode 2.

Third, in particular, in forming the insulating film including a barrier insulating film, low frequency electric power at 100 kHz or more and less than 1 MHz is applied to the lower electrode 3, and in a process of forming a high-pressure insulating film, the low frequency electric power is applied to the lower electrode 3. In this case, the high frequency power may be applied to the upper electrode 2.

Suitable examples of the alkyl compound having the siloxane bond, the methyl silane, the hydrocarbon, the oxygen containing gas and the diluting gas, for the film forming gas of the present invention are listed below.

(i) alkyl compound having siloxane bond:

hexamethyldisiloxane (HMDSO: $(CH_3)_3Si—O—Si(CH_3)_3$)

Octamethylcyclotetrasiloxane (OMCTS:$((CH_3)_2)_4Si_4 O4$

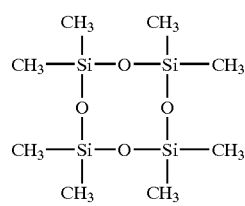

[Formula 1]

tetramethylcyclotetrasiloxane (TMCTS: $(CH_3H)_4Si_4 O4$

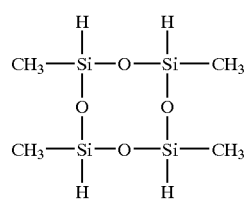

[Formula 2]

(ii) methylsilane $(SiHn(CH3)_{4-n})(n=0, 1, 2, 3)$
monomethylsilane $(SiH_3(CH_3))$
dimetylsilane $(SiH_2(CH_3)_2)$
trimethylsilane $(SiH(CH_3)_3)$
tetramethylsilane $(Si(CH_3)_4)$
(iii) hydrocarbon $(C_xH_y)$
acetylene $(C_2H_2)$
methylcyclohexane $(CH_3C_6H_{11})$
cyclohexane $(C_6H_{12})$
benzene $(C_6H_6)$
(iv) oxygen containing gas
$N_2O$
water $(H_2O)$
carbon dioxide $(CO_2)$
(v) diluting gas
helium (He)
argon (Ar)
nitrogen $(N_2)$ Experimental A silicon insulating film was formed on a Si substrate using plasma enhanced CVD (PE-CVD method) under the following film forming conditions. HMDSO was employed as the alkyl compound having a siloxane bond, $N_2O$ as the oxygen containing gas, and He as the diluting gas. In addition, one minute and thirty seconds is taken as a period (a stabilizing period) for introduction of the gases into the chamber to the start of the film formation, and the upper electrode 2 is heated at 100° C. to prevent reaction-products from sticking thereto.

Film-forming gas
HMDSO flow rate: 50 sccm
$N_2O$ flow rate: 200 sccm
He flow rate: 400 sccm
gas pressure: 0.75 to 1.75 Torr
Conditions for plasma excitation
Lower electrode (first electrode)
low-frequency electric power (frequency 380 kHz) (parameter): 0 to 100 W
Upper electrode (second electrode)
high-frequency electric power (frequency 13.56 MHz): 250 W
Condition for substrate heating: 375° C.

(a) Relation between gas pressure of film-forming gas and exfoliation

Figure 2:
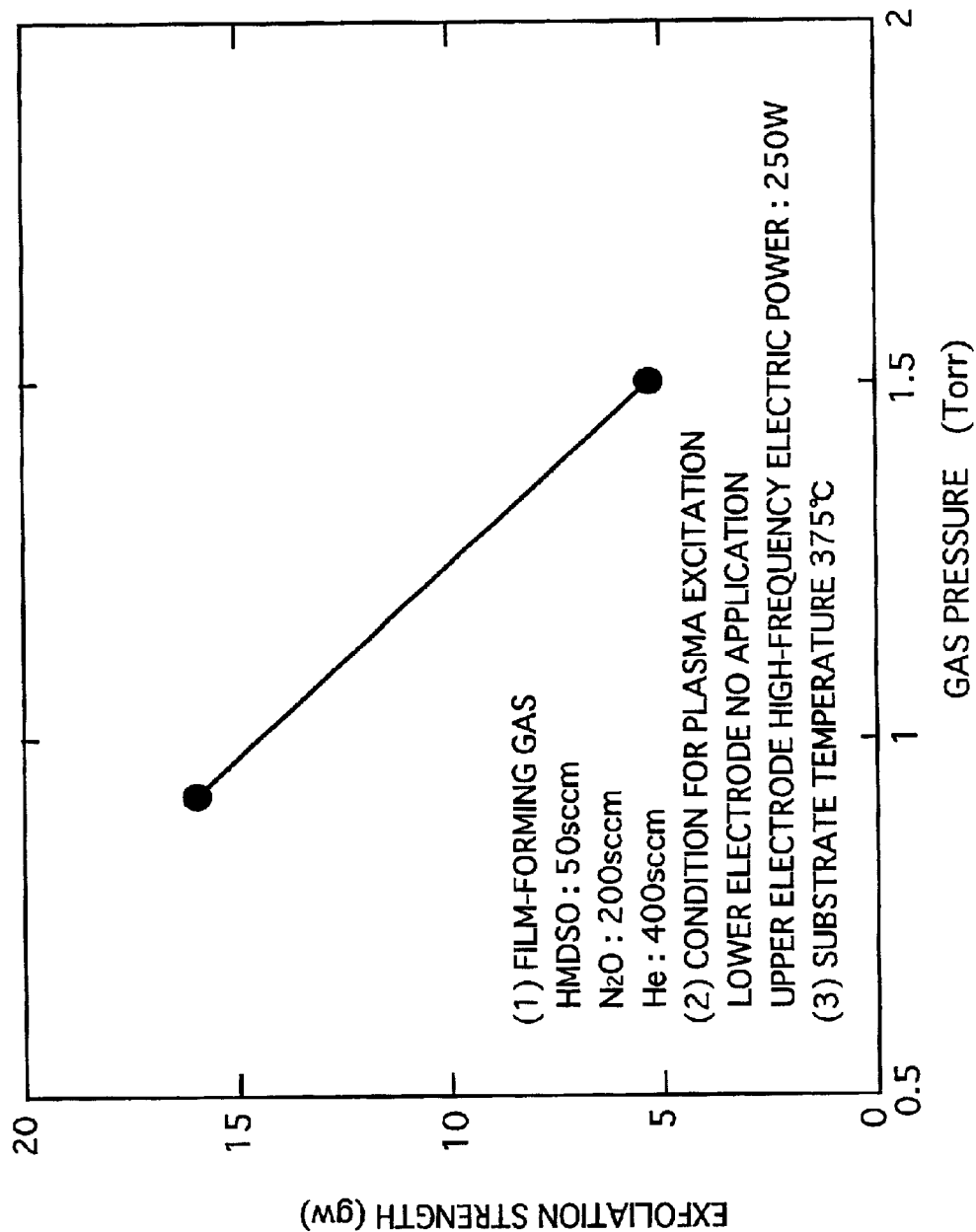
FIG. 2 is a graph of exfoliation intensity versus pressure of a film-forming gas for a low dielectric insulating film according to a first embodiment of the present invention.

FIG. 2 is a view showing the relationship between gas pressure of a film-forming gas and exfoliation of the film formed on a silicon substrate. The ordinates show the exfoliation (gw) of a formed film on a linear scale, and the abscissas show the gas pressure (Torr) of a film-forming gas on a linear scale.

Insulating films for examination were formed on silicon substrates in accordance with the above-described conditions for film forming except that application of the low-frequency electric power to the lower electrode 3 omitted, and under two pressures of the film-forming gas, i.e., 0.9 and 1.5 Torr, respectively. The exfoliation was measured by use of an instrument made by Shimadzu Corporation (Shimadzu Scanning Scratch Tester SST101.)

According to FIG. 2, the exfoliation, which was in the range from 5 to 6 gw in the case of the gas pressure of 1.5 Torr, was significantly improved in the case of the gas pressure of 0.9 Torr by nearly three times, which was in the range from 15 to 16 gw.

It should be noted that, although a silicon substrate was used as a substrate for film forming and the exfoliation was examined with respect to the silicon substrate ink the above experiments, it is conceivable that the exfoliation with respect to a copper substrate would show a similar tendency.

Figure 3:
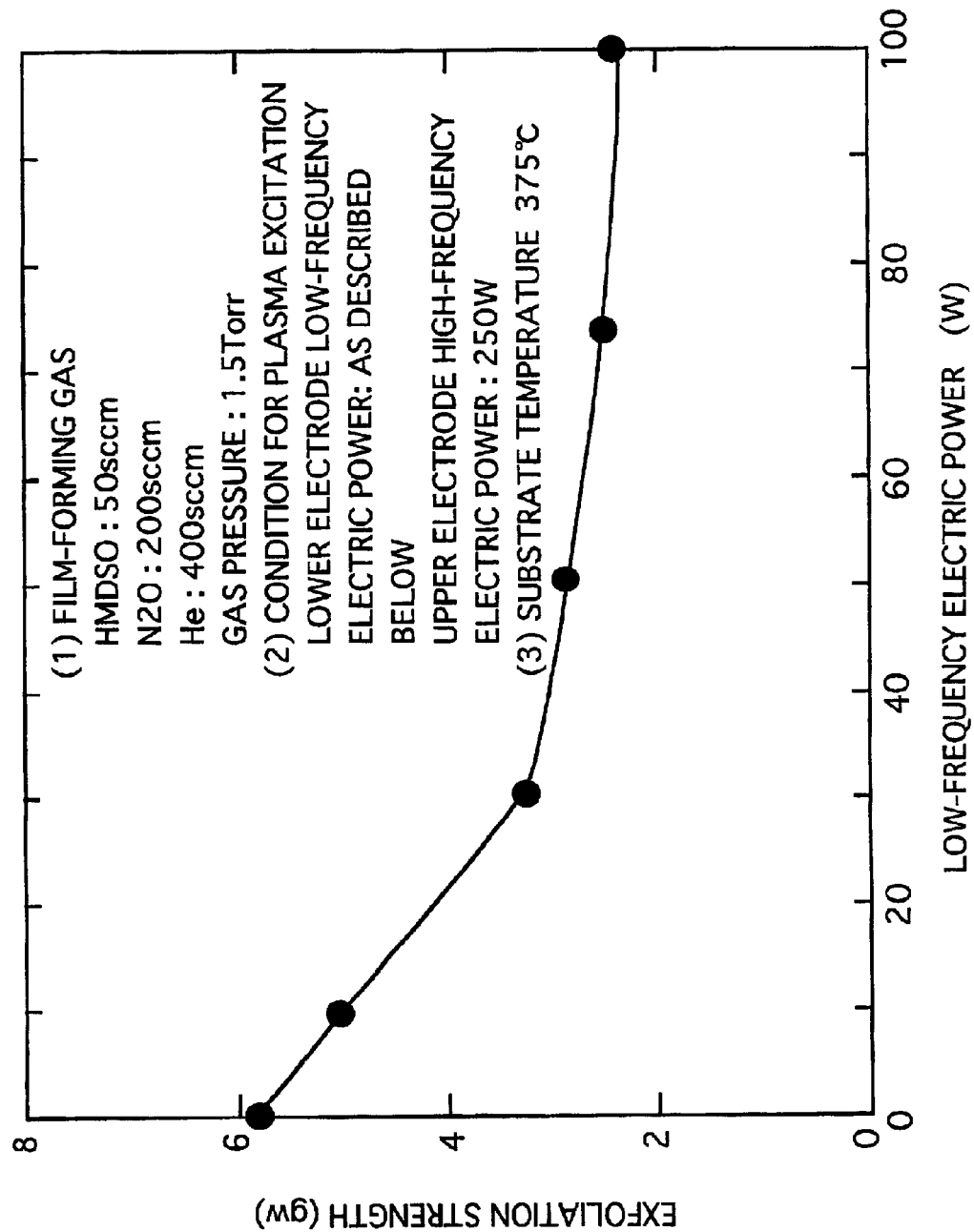
FIG. 3 is a graph of exfoliation versus low-frequency electric power for substrate bias in a plasma of film-forming gas for the low dielectric insulating film according to the first embodiment of the present invention.

(b) Relationship between low-frequency electric power for bias to substrate and exfoliation intensity FIG. 3 is a view showing a relationship between low-frequency electric power of the plasma-excited condition applied to the lower electrode 3 and exfoliation intensity of a film formed on a silicon substrate. The ordinate thereof shows the exfoliation (gw) of a formed film on a linear scale, and the abscissa thereof shows the low-frequency electric power (W) on a linear scale.

Insulating films for examination were formed on silicon substrates in accordance with the above-described conditions for film forming with the pressure of the film-forming gas at 1.5 Torr, and under six different levels of the low-frequency electric power of 0, 10, 30, 50, 75 and 100 W, respectively. The same measurement instrument as in the case (a) was used.

According to FIG. 3, as shown in the range of the low frequency electric power up to 30 W, the exfoliation decreased as the electric power increased, such as from 6 gw at 0 W to 3.3 gw at 30 W. When the low-frequency electric power exceeded 30 W, the exfoliation did not decrease significantly, and stayed around 3 gw.

(c) Relation between gas pressure and film hardness

Figure 4:
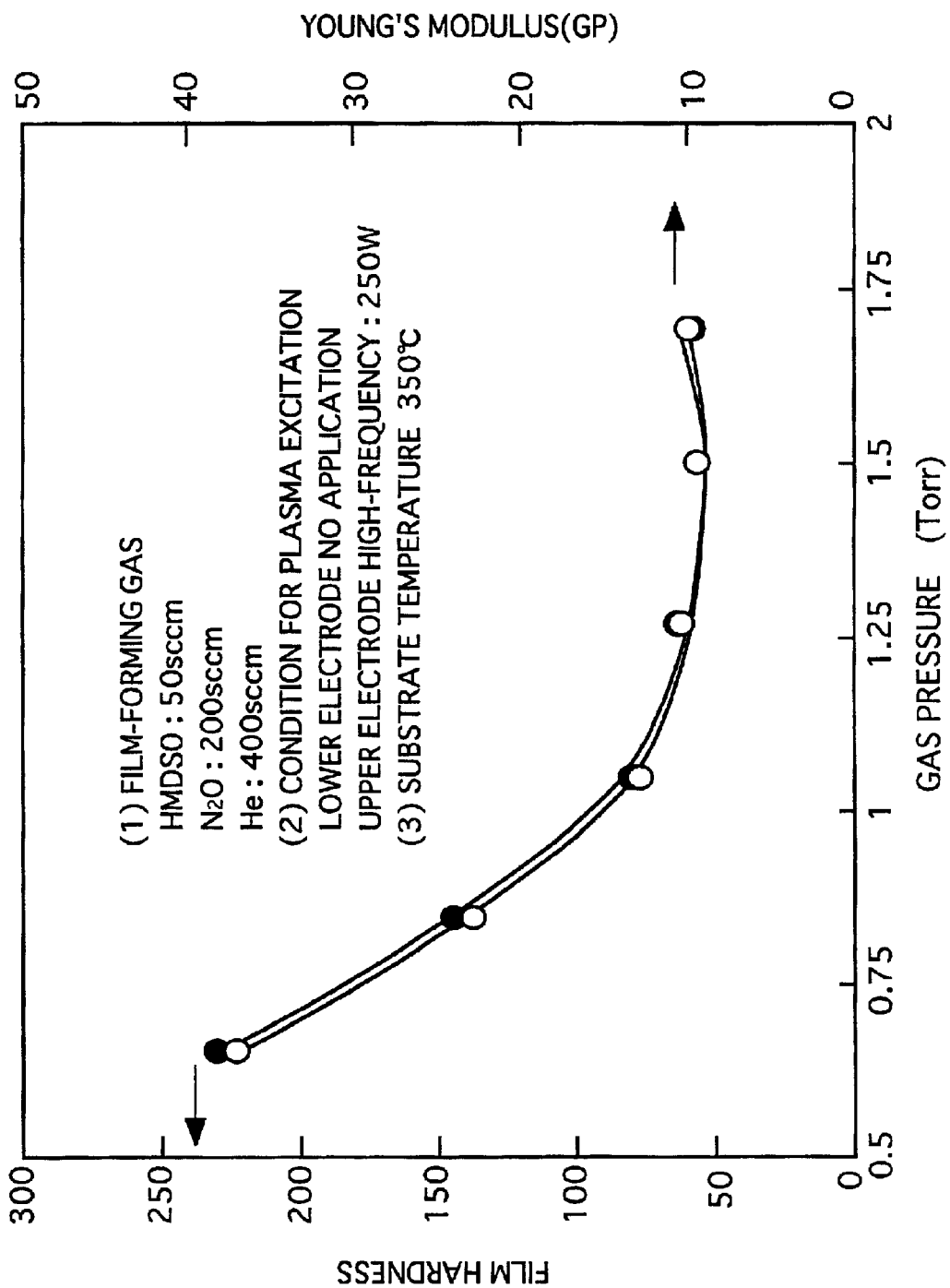
FIG. 4 is a graph of film hardness and Young's modulus versus the gas pressure of the film-forming gas for the low dielectric insulating film according to the first embodiment of the present invention.

FIG. 4 is a view showing the relationship between pressure of a film-forming gas and film hardness as well as Young's modulus of a film formed on a silicon substrate.

The left ordinate shows the film hardness of a formed film on a linear scale graduation, while the right ordinate shows Young's modulus (GP) of the formed film on a linear scale. The abscissa shows the gas pressure (Torr) of a film-forming gas on a linear scale.

Insulating films for examination were formed on silicon substrates in accordance with the above-described conditions for film forming except that the low-frequency electric power to the lower electrode 3 was omitted, and at six pressures of the film-forming gas, i.e., 0.7, 0.9, 1.1, 1.3, 1.5 and 1.7 Torr, respectively. The film hardness and Young's modulus were measured by use of a measurement instrument made by Shimadzu Corporation (Shimadzu Dynamic Ultra Micro Hardness Tester DUH-W2015).

As seen in FIG. 4, in the range of the gas pressure from 0.7 Torr to 1.3 Torr, the film hardness decreases as the gas pressure increases. The film hardness was about 230 when the gas pressure was 0.7 Torr, and around 70 to 80 when the gas pressure was 1.3 Torr. When the gas pressure exceeded 1.3 Torr, the film hardness did not significantly change any more, and stayed around 50.

Young's modulus also showed a tendency substantially similar to that of the film hardness. Young's modulus was about 40 GP when the gas pressure was 0.7 Torr, and it was about 10 GP when the gas pressure was 1.3 Torr. When the gas pressure exceeded 1.3 Torr, Young's modulus stayed around 10 GP.

Figure 5:
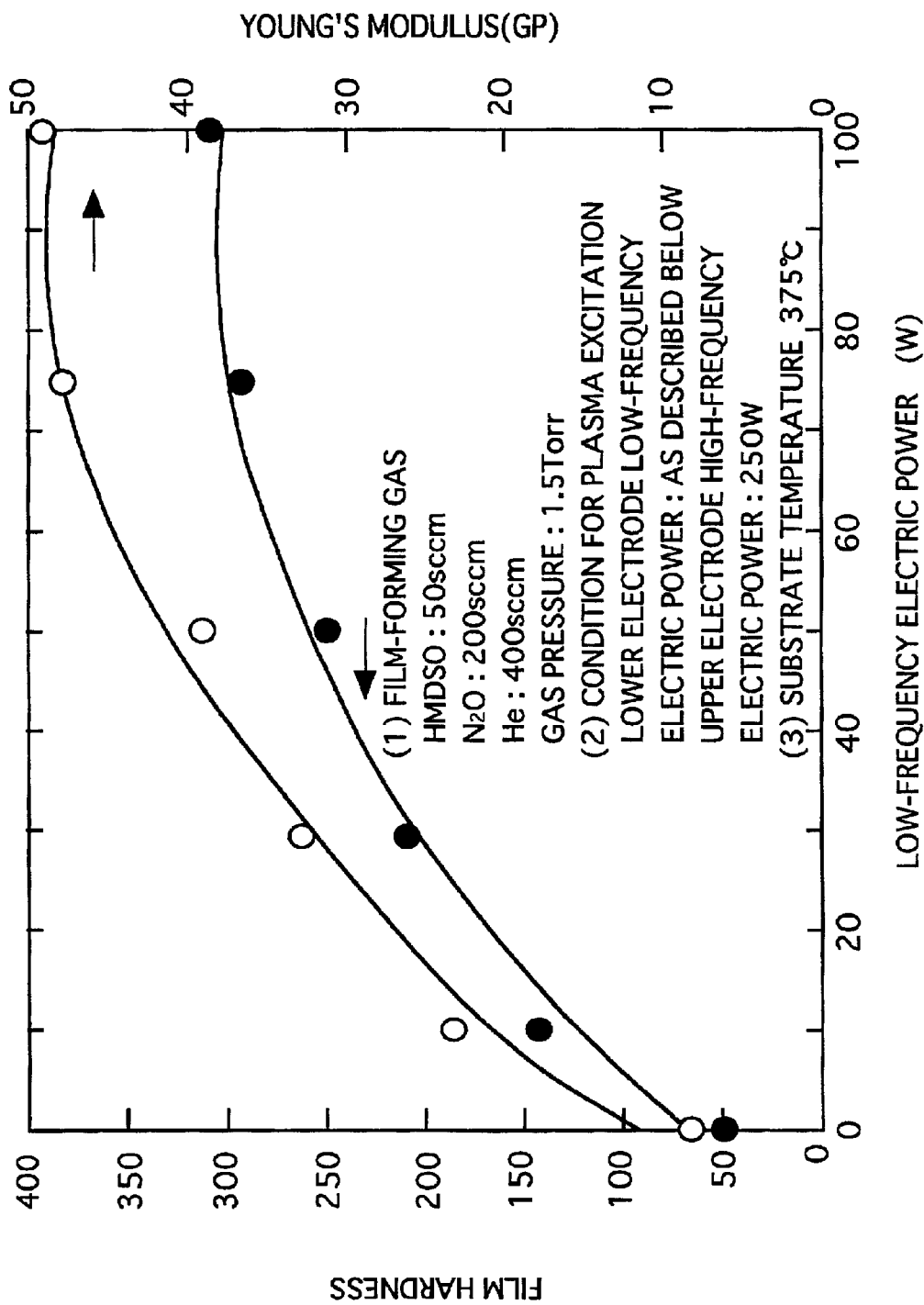
FIG. 5 is a graph of film hardness and Young's modulus versus the low-frequency electric power for substrate bias in forming the low dielectric insulating film according to the first embodiment of the present invention utilizing a gas plasma.

(d) Relationship between low-frequency electric power for bias to substrate and film hardness FIG. 5 is a view showing the relationships between low-frequency electric power applied to the lower electrode 3 for a direct current bias voltage to the silicon substrate, and film hardness as well as Young's modulus of a film formed on the silicon substrate. The left ordinate shows the film hardness of a formed film on a linear scale, while the right ordinate shows Young's modulus (GP) of the formed film on a linear scale. The abscissa shows the low-frequency electric power (W) on a linear scale.

Insulating films for examination were formed on silicon substrates in accordance with the above-described conditions for film forming with the gas pressure of the film-forming gas at 1.5 Torr, and six different levels of low-frequency electric power, i.e., 0, 10, 30, 50, 75 and 100 W, respectively. The same measurement instrument as in the case (c) was used.

As seen in FIG. 5, in a range of the low-frequency electric power from 0 to 75 W, the film hardness increases along with an increase of the electric power. When the low-frequency electric power exceeds 75 W, the increase of the film hardness becomes more gradual. The film hardness was about 50 when the low-frequency electric power was not applied, about 290 at 75 W, and about 300 at 100 W.

Young's modulus also showed a tendency similar to that of the film hardness. Young's modulus was about 8 GP when the low-frequency electric power was not applied, about 47 GP at 75 W, and about 50 at 100 W.

Figure 6:
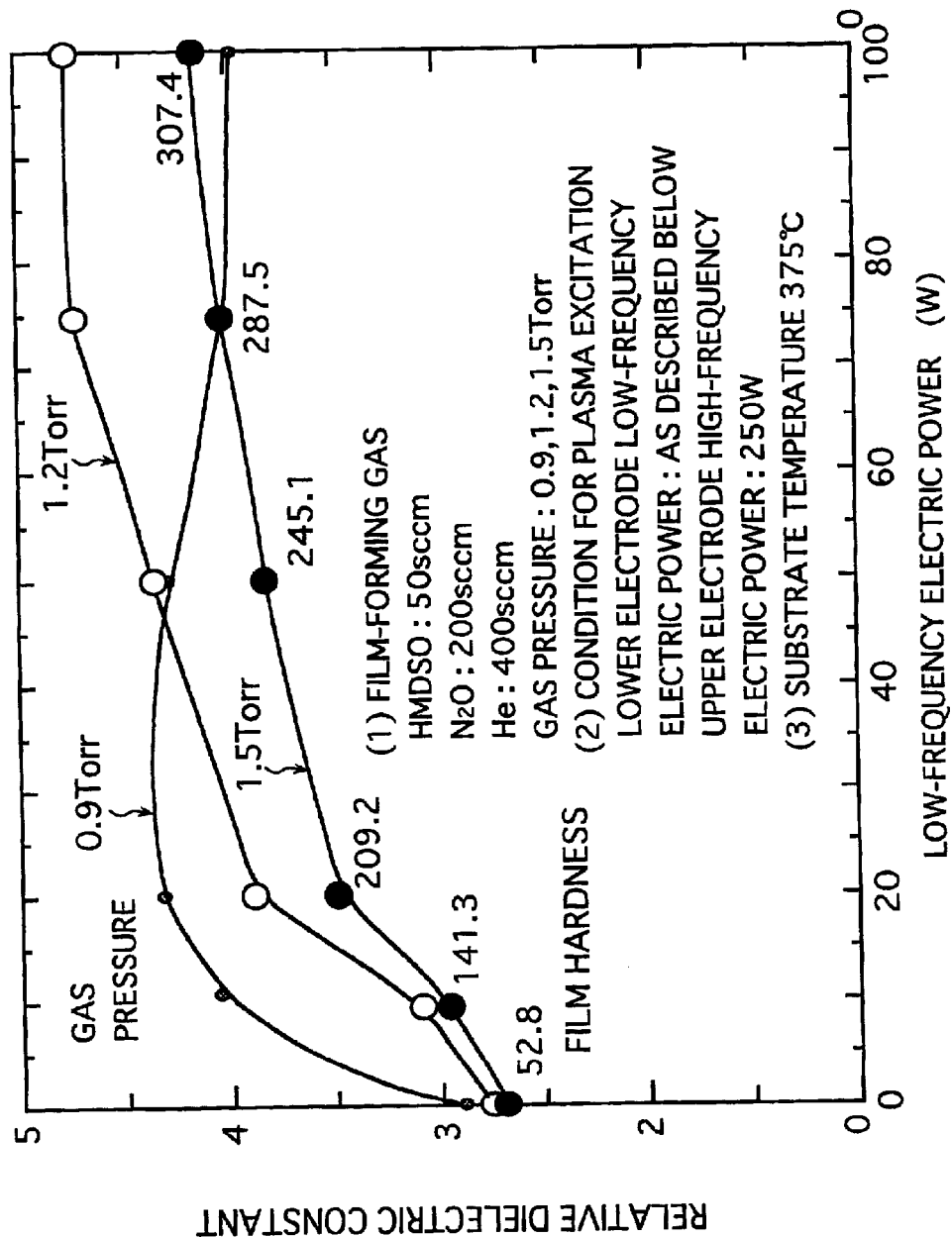
FIG. 6 is a graph of relative dielectric constant versus the low-frequency electric power for substrate bias in forming a low dielectric insulating film according to the first embodiment of the present invention utilizing a gas plasma.
Figure 7:
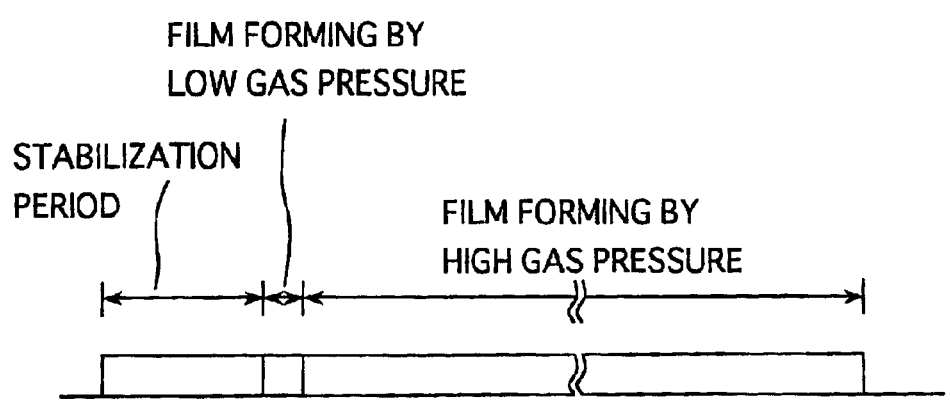
FIG. 7 is a schematic of procedures of film forming according to the first embodiment of the present invention.

(e) Relationship between low-frequency electric power of bias of substrate and relative dielectric constant of formed film FIG. 6 is a view showing relationship, between each level of low-frequency electric power applied to the lower electrode 3 as direct current bias voltage to a substrate and relative dielectric constant of a film formed on the silicon substrate. The ordinate thereof shows the relative dielectric constant of the formed film on a linear scale. The abscissa shows the low-frequency electric power (W) on a linear scale.

Insulating films for examination were formed on silicon substrates in accordance with the above-described conditions for film forming with three different pressures of film-forming gas, i.e., 0.9, 1.2 and 1.5 Torr, respectively, and with six levels of low-frequency electric power, i.e., 0, 10, 20, 50, 75 and 100 W, respectively. The relative dielectric constants were measured by the C-V method, in which a signal of a frequency of 1 MHz is superposed on a direct current bias.

Note that, in the case of the gas pressure of 1.5 Torr in the drawing, the numerals near the examination points represent the film hardness.

As seen in FIG. 6, in the case of the gas pressure of 0.9 Torr, the relative dielectric constant sharply increases in the range of low-frequency electric power from 0 to 20 W, i.e., from about 2.9 to 4.3. The relative dielectric constant then gently decreases as the low-frequency electric power further increases beyond 20 W. In the case of the gas pressure of 1.2 Torr, the relative dielectric constant sharply increases in a range of low-frequency electric power from 0 to 20 W, i.e., from about 2.7 to 3.9. The relative dielectric constant gradually increases beyond 20 W to about 4.8 at 100 W. Also, in the case of the gas pressure of 1.5 Torr, similar to the case of the gas pressure of 1.2 Torr, the relative dielectric constant sharply increases in a range of the low-frequency electric power from 0 to 20 W, i.e., from about 2.7 to 3.6. The relative dielectric constant gradually increases beyond 20 W to about 4.1 at 100 W.

As described above, according to the first embodiment, the exfoliation intensity is large when the film-forming gas pressure is low, however, the relative dielectric constant becomes high. In particular, the exfoliation is large at lower than 1 Torr, and the relative dielectric constant is low at 1 Torr or higher. Further, the exfoliation intensity becomes high and the relative dielectric constant becomes low when the electric power is low.

Therefore, in the case of forming an insulating film having a low dielectric constant as an interlayer insulating film on wiring made from a copper film, it is preferable to lower the gas pressure to below 1 Torr for example, and to lower the low-frequency electric power in an initial stage of film-forming, thus enhancing exfoliation intensity at a little sacrifice of the relative dielectric constant, and then, for the remainder, to perform film forming with gas pressure of 1 Torr or higher for example, thus lowering the relative dielectric constant of the entire film.

Moreover, in the case of forming an insulating film having a low dielectric constant as a barrier insulating film in contact with wiring made from a copper film, the gas pressure is adjusted for a low-pressure insulating film and a high-pressure insulating film, similar to the case of forming the interlayer insulating film, while the frequency of the electric power for plasma excitation is not adjusted but maintained at a low frequency for both the low-pressure insulating film and the high pressure insulating film. That is, it is preferable to lower the gas pressure to below 1 Torr, for example, and to lower the low-frequency electric power at an initial stage of film-forming, thus enhancing exfoliation at little sacrifice of the relative dielectric constant, then for the remainder, to perform film forming with a gas pressure of 1 Torr or higher, for example, thus lowering the relative dielectric constant of the entire film.

It should be noted that, although gas pressure below 1 Torr is preferable at the initial stage of film forming, the gas pressure below 0.1 Torr gives a slow film-forming rate and hence is not practical. Moreover, whereas a gas pressure of 1 Torr or higher is preferable for forming the rest of the film, only a gas pressure up to a maximum of 10 Torr is practical in light of electrical discharge.

Second Embodiment

Next, a semiconductor device and a method of manufacturing the same according to a second embodiment of the present invention will be described with reference to FIG. 8A and FIG. 8B.

Figure 8A:
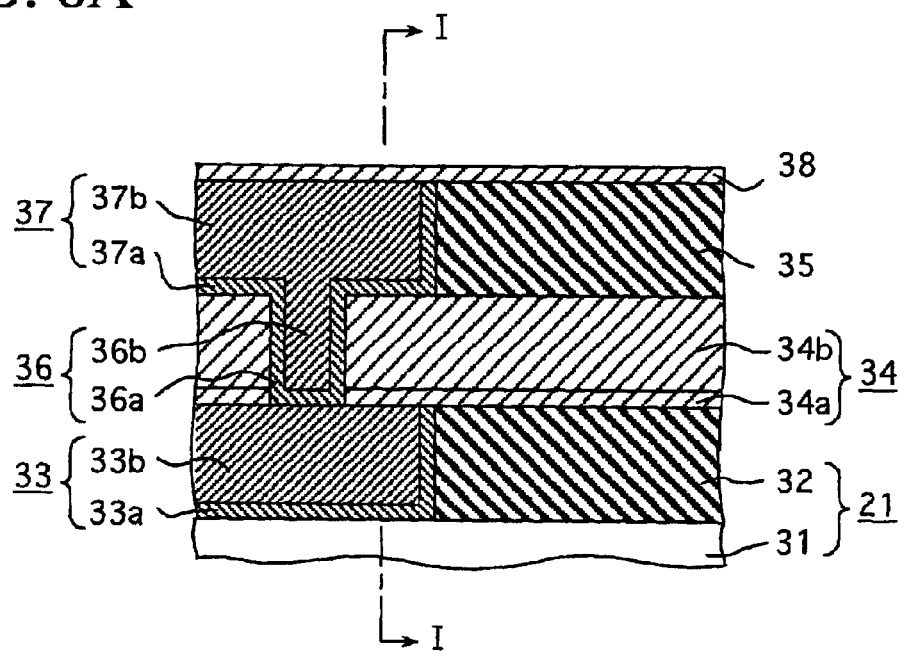
FIG. 8A and FIG. 8B are cross-sectional views of a semiconductor device manufactured according to a second embodiment of the present invention.

FIG. 8A is a cross-sectional view showing a semiconductor device produced by the method of manufacturing a semiconductor device according to the second embodiment of the present invention. FIG. 8B is a cross-sectional view of FIG. 8A taken along a line I—I. A film-forming gas composed of HMDSO+$N_2$O+He is used in order to form an interlayer insulating film 34 between wiring-embedded films, the interlayer insulating film being sandwiched between a lower wiring-embedded insulating film 32 where lower wiring 33 is embedded and an upper wiring-embedded insulating film 35 where upper wiring 37 is embedded.

Firstly, as shown in FIG. 8A, the wiring-embedded insulating film 32 is formed on a base substrate 31, the wiring-embedded insulating film being composed of either a $SiO_2$ film or a SiOCH film having a thickness of about 1 μm. It should be noted that the SiOCH film is an insulating film that contains Si, O, C and H.

Subsequently, a wiring groove is formed by etching the wiring-embedded insulating film 32, thereafter a TaN film 33a is formed inside the wiring groove as a anti-diffusion film for copper. Next, an unillustrated copper seed layer is formed on a surface of the TaN film 33a by sputtering, then a copper film is embedded by plating. The copper film and the TaN film 33a projecting from the wiring groove are then polished by a chemical mechanical polishing (CMP) method, and the surface of the lower wiring is thus planarized. The lower wiring composed of the wiring 33b primarily made of the copper film and the TaN film 33a is thereby formed.

Next, the interlayer insulating film 34 between wiring-embedded films, composed of a PE-CVD SiOCH film having a film thickness of several tens of nanometers, is formed by a plasma enhanced CVD method using HMDSO+$N_2$O+He. A detailed description thereof follows.

Specifically, in order to form the interlayer insulating film 34 between wiring-embedded films, a substrate 21 is introduced to a chamber 1 of a film-forming apparatus 101, and is held on a substrate holder 3. Subsequently, the substrate 21 is heated and maintained at a temperature of 375° C. HMDSO at a flow rate of 50 sccm, $N_2$O gas at a flow rate of 200 sccm, and He gas at a flow rate of 400 sccm are introduced to the chamber 1 of the plasma film-forming apparatus 101 as shown in FIG. 1, and maintained at a pressure of 0.7 Torr. Thereafter, low-frequency electric power at a frequency of 380 kHz in a range from 100 to 150 W is applied to a lower electrode 3, and high-frequency electric power at a frequency of 13.56 MHz at 250 W (equivalent to 0.3 W/cm$^2$) is applied to an upper electrode 2.

The HMDSO, $N_2$O and He are thereby converted into a plasma. This state is maintained for 40 seconds, thus a low-pressure insulating film 34a composed of a PE-CVD SiOC film having a film thickness of about 100 nm is formed. Note that the SiOC film is an insulating film that contains Si, O and C within the film.

Subsequently, film forming is performed with the same combination of reactive gases, the same flow rates thereof, but with the gas pressure adjusted to 1.5 Torr, and under the same condition for the plasma excitation. A high-pressure insulating film 34b composed of a PE-CVD SiOCH film with a film thickness of about 500 nm is thereby formed.

As described above, the interlayer insulating film 34 between wiring-embedded films, composed of the low-pressure insulating film 34a and the high-pressure insulating film 34b, is thereby formed.

Next, the wiring-embedded insulating film 35 composed of either a $SiO_2$ film or a SiOCH film in a film thickness of about 1 μm is formed on the interlayer insulating film 34 between wiring-embedded layers, by the same method used for forming either the $SiO_2$ film or the SiOCH film 32.

Next, a connecting conductor 36 and upper wiring 37 primarily made of a copper film are formed by the well-known dual-damascene method. In the drawing, it should be noted that the reference numerals 36a and 37a denote a TaN film and reference numerals 36b and 37b denote a copper film.

Next, a barrier insulating film 38 is formed over the entire top surface. The semiconductor device is thereby formed.

As described above, according to this second embodiment, in a method of manufacturing a semiconductor device in which the interlayer insulating film 34 for wiring-embedded films is sandwiched between the lower wiring-embedded insulating film 32 where the lower wiring 33 is embedded therein and the upper wiring-embedded insulating film 35 where the upper wiring 37 is embedded therein, initial film-forming is performed with the pressure of the film-forming gas below 1 Torr, and film-forming for the remainder is performed under a gas pressure of 1 Torr or higher by means of the plasma enhanced CVD method in order to form the interlayer insulating film 34 for wiring-embedded films.

The interlayer insulating film 34 for wiring-embedded films with high adhesion to the copper film 33b and with a low relative dielectric constant of 3 or less as a whole can be thereby formed.

The present invention has been described in detail with the second embodiment. However, it should be understood that the scope of the invention is not limited to the example particularly shown in the above-described embodiment, and that various modifications of the above embodiment not departing from the gist of the invention shall also be deemed to be within the scope of the invention.

Instead of HMDSO as used in the second embodiment, another alkyl compound having a siloxane bond as described in the first embodiment, or methylsilane ($SiH_n(CH_3)_{4-n}$: n=0, 1, 2, 3) may be used. As for substitutions for the methylsilane, description will be omitted here as they have been taught in connection with the first embodiment.

Moreover, the film-forming gas may contain any one of acetylene ($C_2H_2$), methylcyclohexane ($CH_3C_6H_{11}$) and cyclohexane ($C_6H_{12}$). Porosity of the film will be enhanced, and thus the dielectric constant will be further decreased.

Moreover, the film-forming gas may contain benzene ($C_6H_6$).

Furthermore, the film-forming gas may contain either methyl alcohol ($CH_3OH$) or ethyl alcohol ($C_2H_5OH$).

Furthermore, any one of argon (Ar) and nitrogen ($N_2$) may be added to the film-forming gas instead of helium (He).

Still further, the barrier insulating film 38 may be formed by the same method as that used for forming barrier insulating film 39a described hereunder in a third embodiment.

Third Embodiment

Figure 9A:
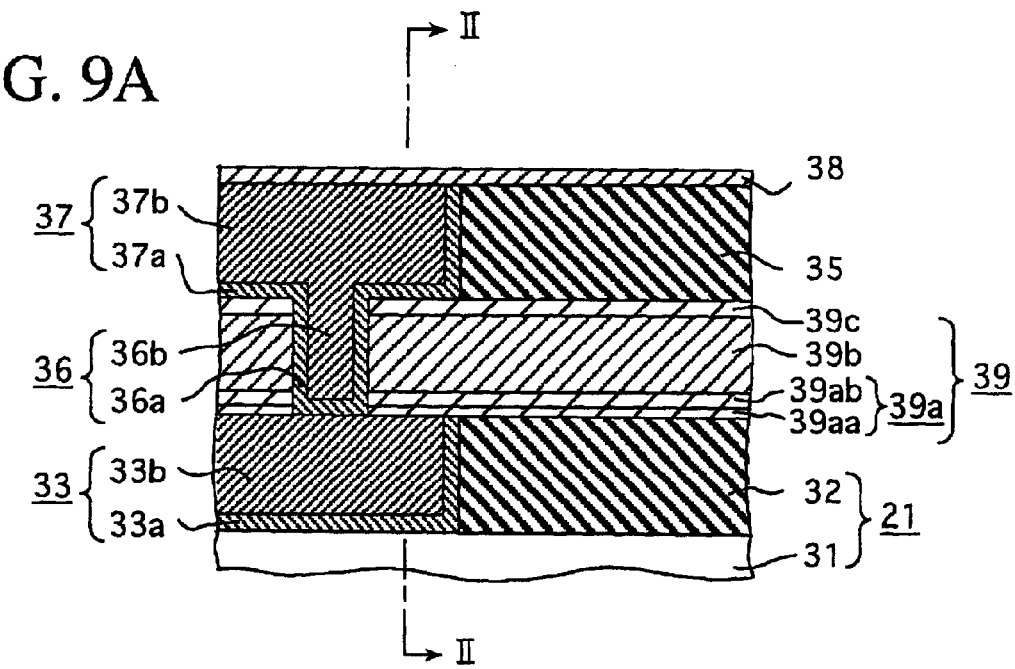
FIG. 9A and FIG. 9B are cross-sectional views showing semiconductor devices manufactured according to third and fourth embodiments, respectively, of the present invention.
Figure 9B:
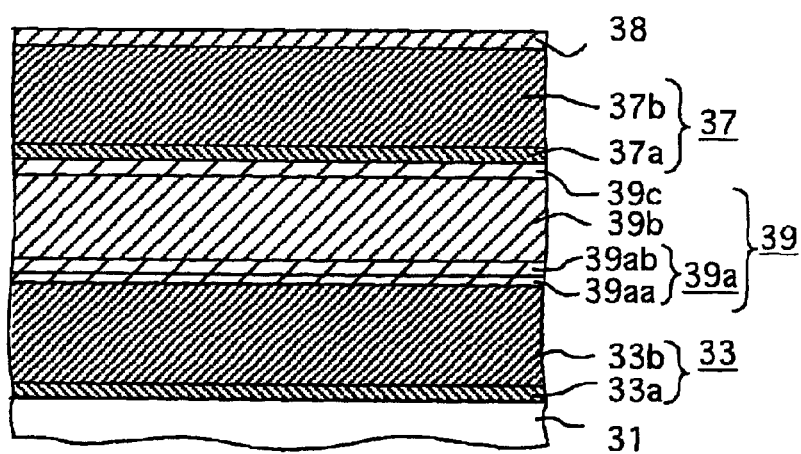

FIG. 9A is a cross-sectional view showing a method of manufacturing a semiconductor device according to a third embodiment of the present invention. FIG. 9B is a cross-sectional view of FIG. 9A taken along a line II—II.

Figure 8B:
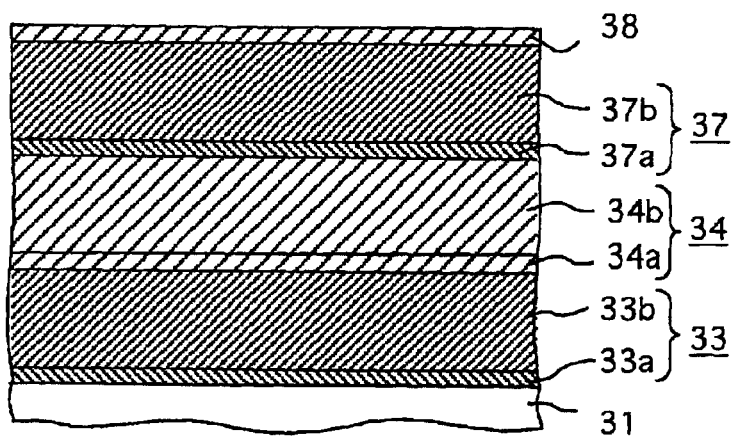

The difference from FIG. 8A and FIG. 8B is that the manufacturing method of the invention is applied particularly to the barrier insulating film 39a that contacts the wiring primarily made of a copper film.

The method of manufacturing a semiconductor device according to the third embodiment will be described with reference to FIGS. 9A and 9B. Regarding FIG. 9A and FIG. 9B, it should be noted that the elements indicated by the same reference numerals as those indicated in FIG. 8A and FIG. 8B. represent the same elements and, accordingly, description thereof will be omitted.

Firstly, by a method similar to that of the second embodiment, a wiring-embedded insulating film 32 is formed on a base substrate 31, the wiring-embedded insulating film being composed of either a $SiO_2$ film or a SiOCH film in a film thickness of about 1 $\mu$m. Lower wiring 33b made of a copper film and a TaN film 33a is formed in a wiring groove of the wiring-embedded insulating film 32.

Next, the barrier insulating film 39a that contacts the copper film is formed by a plasma enhanced CVD method using a film-forming gas composed of $HMDSO+N_2O+NH_3$. A detailed description thereof follows.

Specifically, in order to form the barrier insulating film 39a, a substrate 21 is introduced into a chamber 1 of a film-forming apparatus 101, and is held on a substrate holder 3. Subsequently, the substrate 21 is heated and maintained at a temperature of 375° C . HMDSO at a flow rate of approximately 50 sccm, $N_2O$ at a flow rate of approximately 200 sccm, and $NH_3$ gas at a flow rate of approximately 50 sccm are introduced to the chamber 1 of the plasma film-forming apparatus 101 as shown in FIG. 1, and maintained at pressure of 0.7 Torr. Note that He gas may also be added to the above-described film-forming gas. In this case, the flow rate thereof is satisfactorily set to 400 sccm.

Thereafter, low-frequency electric power at a frequency of 380 kHz and about 150 W is applied to a lower electrode 3. High-frequency electric power is not applied to upper electrode 2.

HMDSO, $N_2O$ and $NH_3$ are thereby converted into a plasma. This state is maintained for 5 seconds, thus a low-pressure insulating film 39aa composed of a PE-CVD $SiO_2$ film with a film thickness of 10 nm is formed.

Subsequently, film forming is performed with the same combination of the reactive gases, the same flow rates thereof, but with the gas pressure adjusted to 1.5 Torr, and under the same conditions for the plasma excitation. A high-pressure insulating film 39ab composed of a PE-CVD SiOCN film with a film thickness of about 90 nm is thereby formed.

As described above, a barrier insulating film 39a composed of the low-pressure film 39aa and the high-pressure film 39ab is formed.

Next, on the barrier insulating film 39a, a main insulating film 39b having a low dielectric constant and a barrier insulating film 39c are serially formed by a generally known method of forming an insulating film having a low dielectric constant. The interlayer insulating film 39 between wiring-embedded layers is thereby formed.

Next, on the interlayer insulating film 39 between wiring-embedded layers, a wiring-embedded insulating film 35, a connecting conductor 36, upper wiring 37 and a barrier insulating film 38 are formed in this order from the bottom.

As described above, according to this embodiment, when the interlayer insulating film 39 including the barrier insulating films 39a and 39c is formed on wiring primarily made of a copper film, initial film-forming is performed so as to form a low-pressure insulating film 39aa and the remainder is formed as a high-pressure insulating film 39ab in order to form the barrier insulating film 39a. And in the course of forming both the low-pressure insulating film 39aa and the high-pressure insulating film 39ab, the film-forming gas is converted into plasma by use of the low-frequency electric power.

Film forming with low-frequency electric power originally imparts a strong adhesion force. However, by forming a film while using a film-forming gas at a low pressure, adhesive strength can be further improved.

The present invention has been described in detail in connection with the third embodiment. However, it should be understood that the scope of the invention is not limited to the example particularly shown in the above-described embodiment, and that various modifications of the above embodiment not departing from the gist of the invention shall also be deemed to be within the scope of the invention.

Instead of HMDSO as used in the third embodiment, another alkyl compound having a siloxane bond as described in the first embodiment, or methylsilane ($SiH_n(CH_3)_{4-n}$: n=0, 1, 2, 3) may be used. As for substitutes for the methylsilane, description will be omitted here as they have been taught in connection with the first embodiment.

Moreover, the film-forming gas may contain a nitrogen-containing gas, i.e., ammonia ($NH_3$) or nitrogen ($N_2$).

Furthermore, the film-forming gas may contain any one of helium (He), argon (Ar) and nitrogen ($N_2$). So-called "clouding" of a formed film may be thereby prevented.

Still further, the barrier insulating film 39b, part of the interlayer insulating film 39, may be formed by the same method of forming the insulating film 34b as described in the second embodiment. Moreover, the barrier insulating film 39c out of the interlayer insulating film 39 may be formed by the same method of forming the insulating film 39a, provided that the side contacting the upper wiring 37 should be formed as a low-pressure insulating film. Furthermore, the barrier insulating film 38 may be formed by the same method of forming the barrier insulating film 39a.

Fourth Embodiment

The above-described embodiments involve forming a barrier insulating film on the main insulating film having a low dielectric constant. However, this invention is advantageous for merely forming the main insulating film having a low dielectric constant using same film-forming gas. In this case, the gas pressure does not have to be changed during the film forming. By use of a film-forming gas containing: an alkyl compound having a siloxane bond; any one of acetylene ($C_2H_2$), methylcyclohexane ($CH_3C_6H_{11}$) and cyclohexane ($C_6H_{12}$); and an oxygen-containing gas, or a film-forming gas containing; an alkyl compound having a siloxane bond; benzene ($C_6H_6$); an oxygen-containing gas; and an inert gas, a desired main insulating film can be formed while maintaining an equal gas pressure.

Now, a method of manufacturing a semiconductor device according to a fourth embodiment will be described with reference to FIG. 9A and FIG. 9B.

The difference from the third embodiment is that, the manufacturing method of the invention is applied particularly to the main barrier insulating film 39b having a low dielectric constant and sandwiched between the barrier insulating films 39a and 39c.

The method of manufacturing a semiconductor device according to the fourth embodiment will be described hereunder. Film-forming conditions for the main insulating film 39b are as follows:

Film-forming gas
HMDSO flow rate: 50 sccm
$N_2O$ flow rate: 200 sccm
$CH_3C_6H_{11}$ flow rate: 50 sccm
gas pressure: 0.9 Torr Conditions for plasma excitation
Lower electrode (first electrode)
low-frequency electric power (frequency 380 kHz): 0 W
Upper electrode (second electrode)
high-frequency electric power (frequency 13.56 MHz): 250 W
Substrate temperature: 375° C.

Firstly, by a method similar to the second embodiment, a wiring-embedded insulating film 32 is formed on a base substrate 31, the wiring-embedded insulating film being composed of a PE-CVD $SiO_2$ film with a film thickness of about 1 $\mu$m. Lower wiring composed of wiring 33b primarily made of a copper film and a TaN film 33a is formed in a wiring groove of the wiring-embedded insulating film 32.

Next, the barrier insulating film 39a that contacts the copper film is formed by a plasma enhanced CVD method using a film-forming gas composed of HMDSO+$N_2$O+$NH_3$, similar to the third embodiment. The barrier insulating film 39a includes a low-pressure insulating film 39aa and a high-pressure insulating film 39ab.

Next, on the barrier insulating film 39a, a main insulating film 39b having a low dielectric constant and a barrier insulating film 39c are serially formed by the plasma enhanced CVD method using the film-forming gas with the above-described film-forming conditions. The interlayer insulating film 39 between wiring-embedded layers is thereby formed.

In order to form the main insulating film 39b having a low dielectric constant, firstly, a substrate 21 is introduced to a chamber 1 of a film-forming apparatus 101, and is held on a substrate holder 3. Subsequently, the substrate 21 is heated and maintained at a temperature of 375° C. HMDSO at a flow rate of 50 sccm, $N_2$O gas at a flow rate of 200 sccm, and $CH_3C_6H_{11}$ at a flow rate of 50 sccm are introduced to the chamber 1 of the plasma film-forming apparatus 101 as shown in FIG. 1, and maintained at a pressure of 0.9 Torr. Next, high-frequency electric power at a frequency of 13.56 MHz and about 250 W (equivalent to 0.3 W/cm$^2$) is applied to an upper electrode 2. In this step, low-frequency electric power is not applied to lower electrode 3.

HMDSO, $N_2$O and $CH_3C_6H_{11}$ are thereby converted into a plasma. This state is maintained for 40 seconds, thus the main insulating film 39b composed of a PE-CVD $SiO_2$ film with a film thickness of about 500 nm is formed.

Next, on the interlayer insulating film 39 between wiring-embedded layers, a wiring-embedded insulating film 35, a connecting conductor 36, upper wiring 37 and a barrier insulating film 38 are serially formed, similar to the second embodiment.

The present invention has been described in detail in connection with the fourth embodiment. However, it should be understood that the scope of the invention is not limited to the example particularly shown in the above-described embodiments, and that various modifications of the above embodiments not departing from the gist of the invention shall also be deemed to be within the scope of the invention.

Instead of HMDSO as used in the fourth embodiment, another alkyl compound having a siloxane bond as described in the first embodiment, or methylsilane ($SiH_n(CH_3)_{4-n}$: n=0, 1, 2, 3) may be used. As for substitutes for the methylsilane, description will be omitted here as they have been taught in connection with the first embodiment.

Moreover, the film-forming gas may contain any one of helium (He), argon (Ar) and nitrogen ($N_2$). In this case, benzene ($C_6H_6$) may be used instead of any one of acetylene ($C_2H_2$), methylcyclohexane ($CH_3C_6H_{11}$) and cyclohexane ($C_6H_{12}$).

As described above, according to the present invention, either an interlayer insulating film sandwiched between a plurality of wirings made of copper films, or a barrier insulating film that contacts wiring primarily made of a copper film is formed by a plasma enhanced CVD method using at least: an alkyl compound having a siloxane bond or methylsilane ($SiH_n(CH_3)_{4-n}$: n=0, 1, 2, 3); and an oxygen-containing gas of any one of $N_2$O, $H_2$O and $CO_2$. wherein film forming is performed under a low gas pressure (below 1 Torr) at an initial stage of film forming, and under a high gas pressure (at 1 Torr or higher) for the remainder of the film forming.

By lowering the gas pressure, an insulating film favorable in adhesion to wiring primarily made of a copper film can be formed. And, by raising the gas pressure, an insulating film of a low dielectric constant can be formed.

Therefore, formation of an interlayer insulating film favorable in adhesion to wiring primarily made of a copper film, as well as having a low dielectric constant becomes feasible.

Moreover, by forming a barrier insulating film by applying low-frequency electric power and performing the above-described two-step adjustment, formation of a barrier insulating film more favorable in adhesion to wiring primarily made of a copper film becomes feasible.

Furthermore, for merely forming a main insulating film having a low dielectric constant, the gas pressure does not have to be changed during the film forming. By use of a film-forming gas containing: an alkyl compound having a siloxane bond; any one of acetylene ($C_2H_2$), methylcyclohexane ($CH_3C_6H_{11}$) and cyclohexane ($C_6H_{12}$); and an oxygen-containing gas or by us of a film-forming gas containing: an alkyl compound having a siloxane bond; benzene ($C_6H_6$); an oxygen-containing gas; and an inert gas, a desired main insulating film can be formed while maintaining an equal gas pressure.

What is claimed is:

1. A method of manufacturing a semiconductor device in which an insulating film is formed on a substrate, said method comprising the steps of:

(a) forming a low-pressure insulating film on the substrate, by converting a film-forming gas at a first gas pressure into a plasma and contacting the substrate with the plasma; and (b) forming a high-pressure insulating film on said low-pressure insulating film, by converting said film-forming gas at a second gas pressure higher than the first gas pressure into a plasma and contacting said low-pressure insulating film with the plasma of said film-forming gas at the higher pressure; and wherein said first gas pressure is in the range of 0.1 Torr to 1 Torr, and said second gas pressure is in the range of 1 Torr to 10 Torr.

2. The method of manufacturing a semiconductor device according to claim 1, wherein parallel plate electrodes including a first electrode holding said substrate and a second electrode opposing said first electrode are used as means for forming said plasma, wherein low-frequency electric power at a frequency of 100 kHz to 1 MHz is applied to said first electrode in step (a), and wherein high-frequency electric power at 1 MHz or higher is applied to said second electrode in step (b).

3. The method of manufacturing a semiconductor device according to claim 2, wherein said low-frequency electric power is applied to said first electrode in addition to application of said high-frequency electric power to said second electrode in the step of forming said high-pressure insulating film.

4. The method of manufacturing a semiconductor device according to claim 2, wherein said high-frequency electric power is applied to said second electrode simultaneously in addition to application of said low-frequency electric power to said first electrode in the step of forming said low-pressure insulating film.

5. The method of manufacturing a semiconductor device according to claim 4, wherein said low-frequency electric power is applied to said first electrode in addition to application of said high-frequency electric power to said second electrode in the step of forming said high-pressure insulating film.

6. The method of manufacturing a semiconductor device according to claim 1, wherein parallel plate electrodes including a first electrode holding said substrate and a second electrode opposing said first electrode are used as means for forming said plasma, wherein low-frequency electric power at a frequency of 100 kHz to 1 MHz is applied to said first electrode in step (a), and wherein said low-frequency electric power is applied to said first electrode in step (b).

7. The method of manufacturing a semiconductor device according to claim 1, wherein said film-forming gas is composed of: an alkyl compound having a siloxane bond; and an oxygen-containing gas selected from the group consisting of $N_2O$, $H_2O$ and $CO_2$.

8. The method of manufacturing a semiconductor device according to claim 7, wherein said alkyl compound having a siloxane bond is any one of hexamethyldisiloxane (HMDSO: $(CH_3)_3Si\text{—}O\text{—}Si(CH_3)_3$), octamethylcyclotetrasiloxane (OMCTS: $((CH_3)_2)_4Si_4O_4$,

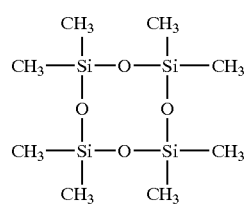

[Formula 3]

and tetramethylcyclotetrasiloxane (TMCTS: $(CH_3H)_4Si_4O_4$

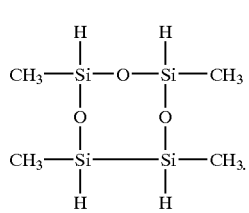

[Formula 4]

9. The method of manufacturing a semiconductor device according to claim 1, wherein said film-forming gas contains methylsilane.

10. The method of manufacturing a semiconductor device according to claim 9, wherein said methyl silane is selected from the group consisting of monomethylsilane, dimethylsilane, trimethylsilane and tetramethylsilane.

11. The method of manufacturing a semiconductor device according to claim 1, wherein said film-forming gas contains methylcyclohexane or cyclohexane.

12. The method of manufacturing a semiconductor device according to claim 1, wherein said film-forming gas contains benzene.

13. The method of manufacturing a semiconductor device according to claim 1, wherein said film-forming gas contains methyl alcohol ($CH_3OH$) or and ethyl alcohol ($C_2H_5OH$).

14. The method of manufacturing a semiconductor device according to claim 1, wherein said film-forming gas contains ammonia or nitrogen.

15. The method of manufacturing a semiconductor device according to claim 1, wherein said film-forming gas contains a gas selected from the group consisting of helium (He), argon (Ar) and nitrogen ($N_2$).

16. The method of manufacturing a semiconductor device according to claim 1 wherein steps (a) and (b) are joined in succession into one continuous film deposition.

17. A method of manufacturing a semiconductor device in which an insulating film is formed on a substrate comprising:

converting a film-forming gas into a plasma, wherein said film-forming gas consists essentially of an alkyl compound having a siloxane bond, a hydrocarbon and an oxygen-containing gas selected from the group consisting of $N_2O$, $H_2O$ and $CO_2$; and contacting the plasma with the substrate to thereby form on the substrate an insulating film having a dielectric constant of 3 or less.

18. The method of manufacturing a semiconductor device according to claim 17, wherein said alkyl compound having a siloxane bond is selected from the group consisting of hexamethyldisiloxane (HMDSO: $(CH_3)_3Si\text{—}O\text{—}Si(CH_3)_3$), octamethylcyclotetrasiloxane (OMCTS: $((CH_3)_3)_4Si_4O_4$

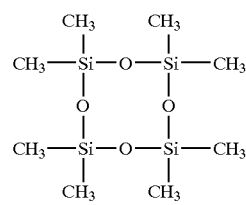

[Formula 5]

and tetramethylcyclotetrasiloxane (TMCTS: $(CH_3H)_4Si_4O_4$

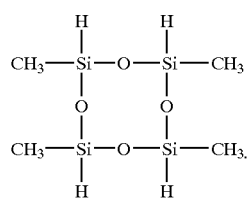

[Formula 6]

19. The method of manufacturing a semiconductor device according to claim 17, wherein said hydrocarbon ($C_xH_y$) is selected from the group, consisting of acetylene ($C_2H_2$), methylcyclohexane ($CH_3H_6H_{11}$), cyclohexane ($C_6H_{12}$) and benzene ($C_6H_6$).

20. The method of manufacturing a semiconductor device according to claim 17,
   wherein said film-forming gas contains a gas selected from the group consisting of helium (He), argon (Ar) and nitrogen ($N_2$).

21. A method of manufacturing a semiconductor device comprising the steps of:
   (a) forming an insulating film on a substrate by converting a film-forming gas which consists essentially of an alkyl compound having a siloxane bond, a hydrocarbon and oxygen-containing gas into a plasma and contacting the substrate with the plasma, wherein said oxygen-containing gas is selected from the group consisting of $N_2O$, $H_2O$ and $CO_2$; and
   (b) forming a barrier insulating film on the insulating film as formed in step (a).

22. A method of manufacturing a semiconductor device in which an insulating film is formed on a substrate, comprising:
   (a) converting a film-forming gas into a plasma wherein said film-forming gas consists essentially of $SiH_n(CH_3)_{4-n}$, wherein n=0, 1, 2 or 3, a hydrocarbon and an oxygen-containing gas selected from the group consisting of $N_2O$, $H_2O$ and $CO_2$;
   (b) contacting the plasma with the substrate to thereby form on the substrate an insulating film having a dielectric constant of 3 or less; and
   (c) forming a barrier insulating film directly on the insulating film having a dielectric constant of 3 or less, as formed step (b).

23. The method of manufacturing a semiconductor device according to claim 22,
   wherein said methylsilane ($SiH_n(CH_3)_{4-n}$: n=0, 1, 2, 3) is selected from the group consisting of monomethylsilane ($SiH_3(CH_3)$), dimethylsilane ($SiH_2(CH_3)_2$), trimethylsilane ($SiH(CH_3)_3$) and tetramethylsilane ($Si(CH_3)_4$).

* * * * *

UNITED STATES PATENT AND TRADEMARK OFFICE
CERTIFICATE OF CORRECTION

PATENT NO. : 6,852,651 B2
DATED : February 8, 2005
INVENTOR(S) : Shioya et al.

It is certified that error appears in the above-identified patent and that said Letters Patent is hereby corrected as shown below:

Column 16,
Line 12, "or and" should read -- or --; and
Line 65, "group," should read -- group --.

Signed and Sealed this

Fourteenth Day of February, 2006

JON W. DUDAS
*Director of the United States Patent and Trademark Office*